United States Patent
Uibel

(10) Patent No.: US 8,231,705 B2
(45) Date of Patent: Jul. 31, 2012

(54) FIRMLY ADHERING SILICON NITRIDE-CONTAINING RELEASE LAYER

(75) Inventor: Krishna Uibel, Kempten (DE)

(73) Assignee: ESK Ceramics GmbH & Co. KG, Kempten (DE)

( * ) Notice: Subject to any disclaimer, the term of this patent is extended or adjusted under 35 U.S.C. 154(b) by 503 days.

(21) Appl. No.: 12/000,007

(22) Filed: Dec. 6, 2007

(65) Prior Publication Data

US 2009/0119882 A1     May 14, 2009

(30) Foreign Application Priority Data

Nov. 8, 2007  (DE) .......................... 10 2007 053 284

(51) Int. Cl.
C22B 9/16  (2006.01)
B32B 1/02  (2006.01)

(52) U.S. Cl. ........ 75/585; 75/686; 156/89.27; 428/34.4; 428/221; 428/446

(58) Field of Classification Search ............... 156/89.27; 164/47; 428/34.1–34.7, 221, 320.2–331, 428/446, 447, 542.8
See application file for complete search history.

(56) References Cited

U.S. PATENT DOCUMENTS

| | | | |
|---|---|---|---|
| 2002/0051889 A1* | 5/2002 | Kanamori et al. | 428/447 |
| 2003/0230835 A1* | 12/2003 | Grassi et al. | 266/239 |
| 2005/0059760 A1* | 3/2005 | Dellwo et al. | 524/409 |
| 2006/0159909 A1* | 7/2006 | Aslan et al. | 428/323 |
| 2007/0054057 A1 | 3/2007 | Matje et al. | |
| 2007/0089642 A1* | 4/2007 | Engler et al. | 106/401 |
| 2007/0099005 A1* | 5/2007 | Leung et al. | 428/447 |
| 2009/0105062 A1 | 4/2009 | Thaler et al. | |
| 2009/0121197 A1 | 5/2009 | Thaler et al. | |
| 2009/0236780 A1 | 9/2009 | Engler et al. | |

FOREIGN PATENT DOCUMENTS

| | | |
|---|---|---|
| DE | 10 2005 050 593 A1 | 4/2007 |
| DE | 10 2006 003 819 A1 | 8/2007 |
| EP | 0 963 464 A1 | 12/1999 |
| EP | 1 985 594 A1 | 10/2008 |
| JP | 2004-291027 A | 10/2004 |
| JP | 2005-271058 A | 10/2005 |
| JP | 2007-146132 A | 6/2007 |
| JP | 2007-268572 A | 10/2007 |
| WO | WO 03/078321 A1 | 9/2003 |
| WO | WO 2004053207 A1 * | 6/2004 |
| WO | WO 2007/039310 A1 | 4/2007 |
| WO | WO 2007039310 A1 * | 4/2007 |
| WO | 2007/085520 A1 | 8/2007 |

* cited by examiner

*Primary Examiner* — Stanley Silverman
*Assistant Examiner* — Syed Iqbal
(74) *Attorney, Agent, or Firm* — The Nath Law Group; Tanya E. Harkins

(57) ABSTRACT

The invention relates to a slip for producing a durable, firmly adhering release layer on a substrate, comprising a suspension of solid particles, wherein the solid particles comprise 67-95% by weight of silicon nitride and 5-33% by weight of an $SiO_2$-based high-temperature binder and the $SiO_2$-based high-temperature binder is derived from $SiO_2$ precursors and has been pretreated by heat treatment in a temperature range of 300-1300° C.

The invention further provides shaped bodies comprising a substrate having a durable, firmly adhering release layer and also processes for producing them. The shaped bodies of the invention are suitable for use in the field of corrosive nonferrous metal melts.

47 Claims, 3 Drawing Sheets

▨ Substrate (fused silica)

▦ Layer according to the invention

▦ Pulverulent layer

▦ Layer applied wet-in-wet or by flooding according to the prior art and having a layer thickness of >200 μm

FIRMLY ADHERING SILICON NITRIDE-CONTAINING RELEASE LAYER

FIELD OF THE INVENTION

The present invention relates to an $Si_3N_4$-containing slip for producing a durable, firmly adhering release layer on a substrate, a shaped body comprising a substrate and a durable, firmly adhering release layer applied thereto which is abrasion-, impact- and scratch-resistant and thermally stable so that the shaped body is transportable, a process for producing such a shaped body and the use of such shaped bodies in the field of corrosive nonferrous metal melts, in particular as melting crucible for use in the field of solar silicon processing, and also the use of such a shaped body as riser tube in aluminium metallurgy, in particular low-pressure aluminium casting.

BACKGROUND OF THE INVENTION

The melting and recrystallization of silicon blocks (ingots) from silicon particles, silicon granules or silicon pieces are carried out using crucibles made of graphite or silicon nitride, but mainly $SiO_2$ (fused silica). Ingots having the desired microstructures and purities crystallize from the melt during precisely defined cooling processes, and these ingots are subsequently cut into thin wafers and form the active constituent of photovoltaic units.

It is important here that the solar silicon quality is not adversely affected by the materials used in processing, e.g. melting crucibles, and the silicon melt can solidify without defects and can be removed undamaged from the crucible. In this context, it is important to prevent corrosive attack of liquid silicon metal on the crucible material, since the melt would otherwise become contaminated. Furthermore, adhesion, infiltration and diffusion lead to problems in the demoulding of the ingots, so that there is a risk of rupture or cracking of the polycrystalline silicon block.

The corrosive silicon melt results in attack on the $SiO_2$ crucible, since a chemical reaction between Si and $SiO_2$ takes place to form volatile SiO. In addition, oxygen and undesirable impurities from the crucible get into the silicon melt in this way.

In particular, adhering material on the solidifying or solidified silicon block is to be avoided at all costs, since silicon undergoes very large thermal expansions so that very small amounts of adhering material lead to mechanical stress and thus to fracture of the crystalline structure, which results in reject silicon material.

In aluminium metallurgy, in particular in low-pressure aluminium casting, riser tubes made of iron alloys or fused silica are used. Due to the highly corrosive aluminium melt at temperatures in the range from 650 to 800° C., these riser tubes have to be coated with refractory oxides or nitrides at regular intervals in order to avoid excessively rapid corrosion of these materials by the liquid aluminium. In the case of iron alloys, the corrosion mechanism is a dissolution mechanism, while in the case of fused silica silicon dioxide reacts with the molten aluminium according to the reaction equation:

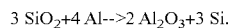

3 $SiO_2$+4 Al-->2 $Al_2O_3$+3 Si.

Adhering reaction products and melt residues are formed on the fused silica riser tube and different coefficients of expansion between riser tube and corrosion products lead to premature failure of the riser tube. Use is usually made here of coatings of aluminium oxide or boron nitride which are applied from slips containing organic binders by dipping, brushing or spraying. However, as a result of the combined corrosive and mechanical attack by the hot melt and the floating slag, the life of such coatings is limited to hours or a few days. Riser tubes made of silicon nitride ceramic, which are completely inert towards corrosive attack by aluminium melts, are also used as alternatives to the coated riser tubes made of iron alloy or fused silica. However, the costs of these silicon nitride tubes are many times that of standard riser tubes having a coating.

PRIOR ART

Melting crucibles made of fused silica, graphite or ceramic and provided with silicon nitride layers for the purpose of avoiding sticking between melting crucible and nonferrous metals after contact of the melting crucible with solidifying nonferrous metal melts, e.g. silicon melts, are known from EP 963 464 B1. Here, the layers comprise a high-purity silicon nitride powder. These powder coatings are applied directly by the user before use of the melting crucibles and are produced by dispersing high-purity silicon nitride powder in a solvent and then applying it to the crucibles by, for example, spraying of the suspension. The solvent and any organic binder constituents used have to be removed by thermal after-treatment.

The high-purity silicon nitride itself has been found to be very chemically resistant towards silicon melts. However, the weight of the melt alone leads to forced wetting or infiltration of the porous silicon nitride powder layer. This therefore has to have such a thickness that it cannot be totally infiltrated and can therefore still serve as release or demoulding layer. However, such thick layers are in turn correspondingly soft and not particularly abrasion-resistant, so that particular care has to be taken when charging the crucibles, not to mention long transport routes or the dispatch of ready-to-use coated crucibles.

These conventional crucible coatings for use in the field of solar silicon thus have the disadvantage that the coatings have a low mechanical stability, so that coating always has to be carried out immediately before charging of the crucibles with the silicon powder, chips or pieces. Prior coating of the crucibles other than directly at the point of use is thus not possible. Furthermore, owing to the soft powder coatings, extreme care has to be taken when charging the crucibles with large pieces of material in order to avoid damage to the layer. In addition, undesirable caked residues occur because of infiltration of the porous silicon nitride powder layer by the molten silicon. Introduction of silicon nitride into the silicon ingot likewise occurs.

To alleviate these problems, WO 2007/039310 A1 proposes a melting crucible having a coating comprising from 80 to 95% by weight of silicon nitride and from 5 to 20% by weight of a low-temperature mineral binder, with the total oxygen content of the coating being in the range from 5 to 15% by weight. The low-temperature binder is preferably an $SiO_2$-based binder, but it is also possible to use silicon oxynitride. However, the low-temperature mineral binder can likewise be a sol-gel binder or an organometallic compound based on silicon chemistry or comprise $SiO_2$ nanoparticles. The coatings are fired at temperatures below 800° C. and preferably below 500° C. in order to keep oxidation of the silicon nitride low. Three preferred coating methods are described for this purpose.

In the first method (reactive layer), silicon nitride powder and organometallic compounds of silicon chemistry from the group consisting of siloxanes, tetraethyl orthosilicate, tetraethoxysilane, polydimethylsilane or combinations thereof are mixed and a crucible is subsequently sprayed with this mixture with the aid of a reactive liquid from the family consisting of ammonium chloride, ammonia and nitrate solution. The crucible with the applied coating is then heated to a temperature below 500° C. to stabilize the coating.

In the second method (binder solution), the silicon nitride powder is mixed with an $SiO_2$-based binder from the group consisting of silicone oil, siloxanes, chlorosilane or combinations thereof and this mixture is subsequently sprayed on with the aid of a reactive liquid from the family consisting of acids (hydrochloric acid, nitric acid, silicic acid, silicon tetrachloride or another suitable acid). The coated crucible is then heated to a temperature below 500° C. to remove reaction liquids.

In the third method (saturated solution and precipitation), silicon nitride powder is mixed with $SiO_2$ submicron particles and/or $SiO_2$ nanoparticles, preferably colloidal $SiO_2$, and this mixture is subsequently strengthened on the crucible surface by thermal reaction or chemical reaction using a suitable neutralizing agent. The coated crucible is then heated to temperatures below 500° C., preferably before use.

DE 10 2005 050 593 A1 describes a slip comprising silicon nitride and a binder for producing a durable hard coating, with the binder comprising nanosize solid particles and/or precursors thereof prepared by a sol-gel process. The layers which can be produced therefrom are impermeable and have a good adhesive strength, but it is only possible to apply defect-free coatings up to a maximum layer thickness of about 180 µm by this method.

In the coating methods described in WO 2007/039310 A1 and DE 10 2005 050 593 A1, sols or ceramic precursors (e.g. salts or organometallic compounds) of $SiO_2$ are used, either activated (e.g. by means of acid, base or water) or unactivated. However, it has been found that these coating agents inevitably lead to formation of defects in the coating.

In application of these coatings by dipping, flooding or wet-in-wet spraying, it is not possible to apply layer thicknesses of greater than 180 µm without cracks or other defects being formed. However, defect-free coatings having a high layer thickness are very important for coating crucibles on an industrial scale, since the surfaces of the crucibles have a certain roughness and the surfaces have to be coated by a certain minimum thickness even at the relatively high points. A higher layer thickness is also required for the coating of large crucibles.

Application of powder (coating by means of spraying) also cannot entirely avoid these disadvantages. In addition, such an application of powder brings with it the disadvantage of inhomogeneity of the layer in respect of binder and pore distribution (and thus reduced strength) and also silicon nitride contamination in the later process during melting of the ingots (as in EP 0 963 464 B1).

In addition, the binder concentration in the fired coating cannot be set reproducibly when using this type of low-temperature binders under process conditions of industrial manufacture, since the binder changes continually during the synthesis as a function of temperature, atmospheric humidity and storage time and the properties change continually during and after application of the silicon nitride layer as a function of drying rate, atmospheric humidity and ambient temperature. These changes in the binder can be attributed to hydrolysis and condensation reactions.

A system of this type is significantly more difficult to control when it is mixed or activated immediately before the synthesis or during application (as described in WO 2007/039310 A1, in particular in the case of the first two preferred coating methods), since reproducible behaviour in terms of the binder reactivity, binding, shrinkage, diffusion into the substrate or evaporation of low molecular weight precursors or condensates cannot be regulated because of the high reactivity of the components.

In the case of low-temperature binders, diffusion of the binder (sol-gel, salts, precursors of $SiO_2$, intermediates) can also diffuse into the porous substrate and low molecular weight components of the binder can vaporize during drying, so that the composition of the layer becomes depleted in binder in an uncontrollable way. Depletion of the coating in binder at the contact surface to the crucible leads to increased chipping, in particular during firing of the coating or during the process of ingot production.

The layer defects occurring in the coatings, e.g. cracks perpendicular to the layer surface and in particular chipping, can result in adhesion of silicon to the crucible material during ingot production. Chipping (detachment of flakes of the coating to the total depth, possibly including crucible material) results from cracks in the region of the contact zone between coating and substrate which lead to local detachment of the coating. As a result, adhesion of the metal melt to the crucible wall can occur when the crucibles are used. This adhesion can be increased when the metal melts undermines the coating. The adhering silicon on the crucible material is formed, in particular, during the process phase while the silicon in the crucible is liquid. The larger the amount of adhering material or the more regions of adhering material, the greater the risk that cracks will be formed in the ingot during solidification, which reduces the yield of usable silicon for solar cell production.

It has been found that, for example, the surface activity of the silicon nitride powder can differ significantly from batch to batch, irrespective of the manufacturer. These differences can be evened out to a certain extent by heat treatment of the powder before mixing with a low-temperature binder (e.g. binders from Inomat, TEOS and others), but not to such an extent that the desired properties of the $Si_3N_4$-containing layers produced therefrom no longer differ from one another.

In addition to the abovementioned disadvantages, there is a disadvantage in terms of occupational hygiene since precursors and reactive groups are present in the coating suspensions in WO 2007/039310 A1 and DE 10 2005 050 593 A1. For example, the respirable TEOS used in WO 2007/039310 A1 is a volatile irritant component, and the binder components such as $SiO_2$ nanoparticles, precursors of $SiO_2$ nanoparticles or low-molecular weight polymeric structures composed of $SiO_2$-containing organometallic compounds which are used in WO 2007/039310 A1 and DE 10 2005 050 593 A1 are likewise respirable and can be breathed in or contacted during spray application in particular. In addition to extraction, a filtering half-mask FFAP2 in accordance with EN 404 and also at least gloves and safety glasses as body protection are necessary as occupational hygiene measures (for example during processing of a coating suspension as described in Example 1b in WO 2007/039310 A1).

OBJECT OF THE INVENTION

It is therefore an object of the invention to provide a slip for producing a durable, firmly adhering release layer on a substrate, which release layer is particularly suitable for applications in the field of solar silicon processing without having the disadvantages known in the prior art. The slip should, in particular, make it possible to obtain defect-free coatings having a higher layer thickness and improved adhesive strength. In addition, a durable and inexpensive coating for applications in aluminium metallurgy should be provided and, in particular, the operating life for riser tubes should be increased.

SUMMARY OF THE INVENTION

The abovementioned object is achieved by a slip for producing a durable, firmly adhering release layer on a substrate according to Claim 1, a shaped body according to Claim 13 comprising a substrate having a durable, firmly adhering release layer, a process for producing such a shaped body according to Claim 24 and the use of such a shaped body according to Claims 27-29. Advantageous or particularly useful embodiments of the subject matter of the patent application are indicated in the subordinate claims.

The invention accordingly provides a slip for producing a durable, firmly adhering release layer on a substrate, comprising a suspension of solid particles, wherein the solid particles comprise 67-95% by weight of silicon nitride and 5-33% by weight of an $SiO_2$-based high-temperature binder and the $SiO_2$-based high-temperature binder is derived from $SiO_2$ precursors and has been pretreated by heat treatment in a temperature range of 300-1300° C.

The invention further provides a shaped body which comprises a substrate having a durable, firmly adhering release layer, with the release layer comprising 67-95% by weight of silicon nitride and 5-33% by weight of an $SiO_2$-based high-temperature binder and having a total oxygen content of 5-21% by weight and can be obtained by a process comprising the steps a) provision of a substrate, b) application of a slip according to the invention to the substrate and c) hardening of the applied slip by firing at an elevated temperature to form the durable, firmly adhering release layer.

The invention further provides for the use of a shaped body according to the invention in the field of corrosive nonferrous metal melts, in particular the use of a shaped body in the form of a melting crucible for producing silicon melts and the use of a shaped body in the form of a riser tube in aluminium metallurgy, in particular low-pressure aluminium casting.

It has surprisingly been found that particularly thick, defect-free layers which adhere well and are not powdery can be applied by means of the slips of the invention. Contamination of the ingot with silicon nitride is extremely low. Compared to the pulverulent coating according to EP 963 464 B1 and also WO 2007/039310 A1, contamination of the Si ingot with silicon nitride is significantly lower in the case of the coatings according to the invention.

It has been found that the layers according to the invention can be bound durably and thermally stably to substrate surfaces at particularly high layer thicknesses of up to 3 mm. The layers are resistant to contact and not powdery.

The binding effect in the layers is predominantly due to the binding action of the thermally treated $SiO_2$-based binder, with slight oxidation of the silicon nitride during firing reinforcing bonding in the release layer. It has been found that, in the case of the coating according to the invention, the oxidation of the silicon nitride in air at the firing temperatures employed can be reduced significantly compared to a binder-free silicon nitride coating according to EP 963 464 B1 under identical process conditions, with the proportion of oxidized silicon nitride being able to be reduced by 20-50%.

The slips of the invention can be applied by the preferred application methods of dipping, flooding and wet-in-wet spraying. These methods are preferred because more homogeneous and denser layers can be applied than in the case of spraying (powder application). These application methods result in the pore size of the fired coatings being smaller and the adhesive strength, impact resistance and scratch resistance being increased compared to layers applied by powder techniques. The layers become resistant to contact and transport-stable and the contamination of the ingot by constituents of the layer decreases significantly.

The slips are storage-stable and can also be produced using water as suspension medium, which is advantageous for transport and processing since no dangerous goods then have to be transported and combustible substances do not have to be employed for coating the substrates.

Compared to the layers described in EP 963 464 B1 and WO 2007/039310 A1, the layers according to the invention display a better adhesive strength on the crucible material and, unlike these conventional layers, they are not powdery. In addition, the slips of the invention allow layers which are denser than those in EP 963 464 B1 and WO 2007/039310 A1 to be produced, i.e. layers which have no large pores.

In the coating suspension of the invention, the thermally treated $SiO_2$-based high-temperature binder is not present as nanodisperse phase or as a sol or as ceramic precursors or as mixtures thereof (precursor, monomer, fractal accumulations of monomers or polycondensate) but as dispersed $SiO_2$ solid or as $SiO_2$ solid adhering to silicon nitride.

This $SiO_2$ solid differs significantly in terms of its properties from the original sol. The sinter activity is reduced, so that, in contrast to the coatings known from the prior art which contain low-temperature binders (WO 2007/039310 A1, DE 10 2005 050 593 A1), pronounced sintering and shrinkage of the binder do not occur. This results in lower stresses in the coating, so that significantly fewer defects are formed in the substrate surface or in the coating (both after coating and after firing and also during the process), for instance chipping (detachment of flakes of coating to the total depth, possibly including crucible material) or cracks and microcracks or even the formation of entire networks of cracks.

In the case of a layer produced in this way, the adhesion of the layer to the substrate is surprisingly stronger than the cohesion of the layer, depending on the binder concentration in the layer within the conditions according to the invention (particularly important factors are the preignition temperature of the binder and the firing temperature of the coating, depending on the binder concentration). It is also surprising that, despite the reduced sinter activity of the binder, the adhesion of the layer to the substrate is very good. This finding is novel and makes it possible to apply and fire nonpulverulent defect-free layers having particularly high layer thicknesses and good adhesive strength to the substrate.

The good layer properties lead to excellent process-relevant properties: owing to the nonpulverulent layer, there is no or at the most very low contamination of the silicon ingot, most is insensitive to impact and makes unproblematical charging of the coated crucible with pieces possible. Furthermore, coating of large crucibles ("jumbo crucibles") is also possible and the adhesion of the coating to the crucible material is excellent in the entire process temperature range of ingot manufacture. In particular, the coating has the advantage that defects such as chipping, cracks and inhomogeneities in the coating are significantly reduced during use of the coated crucibles. This is evidenced by data gathered by ingot manufacturers, for example the number of cracks in the ingot and the amount of foreign inclusions. Among other things, these data give information about the yield of usable silicon for solar cell production. The use of the slip according to the invention enabled the number of cracks in the ingot in continuous production to be reduced to below the level normal in production of pulverulent silicon nitride layers, and this at a narrow number distribution of cracks per ingot. The number of inclusions was also reduced. The yield and process stability during ingot production were increased.

During charging of conventional crucibles or during melting of lumpy silicon, damage to the coating can occur, even if inhomogeneities or defects in the coating have not been formed during application or firing. Owing to the low strength of the layer or lower adhesion to the substrate in the case of coatings according to EP 963464 B1 and WO 2007/039310 A1, detachment of the layer due to impact, shear, scratching or frictional stress is high and a thin residual layer, if any, remains. The layers according to the invention are not damaged or damaged to a significantly lesser extent by mechanical stress during charging. If detachment of the layer nevertheless occurs, this is significantly lower in the case of the layers according to the invention, so that the barrier or release action and function of the layer is maintained.

The simplified application by means of flooding, which is preferred according to the invention, significantly reduces the times for application of the coating to substrate material. A spray application to produce pulverulent layers according to the prior art on a standard solar crucible having a base area of 690×690 mm² and wall areas of 690×400 mm² typically takes 20-50 minutes. Application by means of flooding using the coating suspension of the invention takes about 5-10 minutes. It is likewise possible to accelerate application by means of spraying, which typically takes 10-15 minutes for a standard crucible. In addition, wet-in-wet spraying makes it possible to use commercial glazing robots.

BRIEF DESCRIPTION OF THE DRAWINGS

The invention is illustrated with the aid of the drawings. Here.

DETAILED DESCRIPTION OF THE INVENTION

Figure 1:
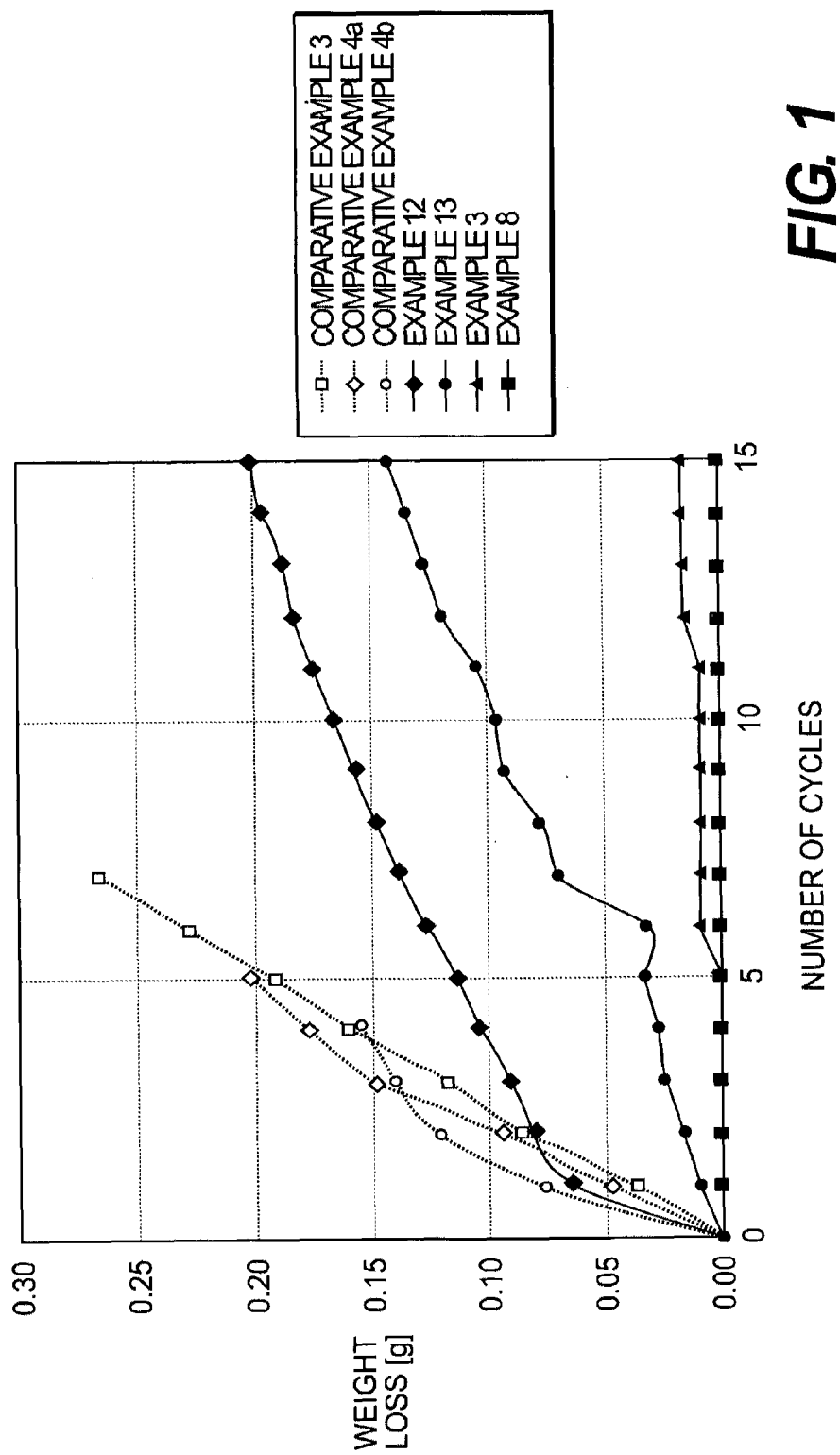
FIG. 1 shows the results of the tape test.

The $SiO_2$-based high-temperature binder used according to the invention is derived from $SiO_2$ precursors and has been pretreated by heat treatment in a temperature range of 300-1300° C. For the purposes of the present invention, $SiO_2$ precursors are materials which can form $SiO_2$ as a result of heat treatment.

The $SiO_2$-based high-temperature binder is preferably derived from organosilicon $SiO_2$ precursors prepared via a sol-gel process, more preferably from a nanocomposite comprising organosilicon $SiO_2$ precursors prepared via a sol-gel process and likewise containing nanosize solid particles. These $SiO_2$ precursors or nanocomposites containing $SiO_2$ precursors are then converted into the $SiO_2$-based high-temperature binders by heat treatment in a temperature range of 300-1300° C.

The nanosize solid particles are preferably selected from among $SiO_2$, $TiO_2$, $ZrO_2$, $Al_2O_3$, AlOOH, $Y_2O_3$, $CeO_2$, carbon and/or BN or from among precursors of these nanosize solid particles which are converted into these solid particles by means of the sol-gel process. The solid particles are particularly preferably $SiO_2$ particles.

The nanocomposites which are preferably used according to the invention and their preparation by the sol-gel process are known from the prior art, in particular from DE 103 26 815 A1. Preference is here given to the nanosize solid particles having been surface-modified by a surface-modifying agent having a molecular weight of less than 1500, in particular a surface-modifying agent which contains an anhydride group, acid amide group, amino group, SiOH group, hydrolysable radicals of silanes and/or a β-dicarbonyl group.

According to a preferred embodiment, such a nanocomposite can be obtained by the sol-gel process by reaction of nanosize solid particles with one or more silanes of the general formula (I):

$$R_xSiA_{(4-x)} \qquad (I)$$

where the radicals A are identical or different and are hydroxyl groups or hydrolysable groups, the radicals R are identical or different and are nonhydrolysable groups and x is 0, 1, 2 or 3, with at least 50 mol % of the silanes having $x \geq 1$. If only silanes of the formula (I) having x=0 are used, purely inorganic nanocomposites are obtained, while otherwise the preferred organic-inorganic nanocomposites are obtained. These nanocomposites are converted into the $SiO_2$-based high-temperature binders by heat treatment in a temperature range of 300-1300° C.

In another embodiment, the $SiO_2$-based high-temperature binder can be obtained by the sol-gel process by reaction of one or more silanes of the above general formula (I) and heat treatment of the resulting reaction product in a temperature range of 300-1300° C.

Suitable examples of silanes of the above formula (I) are likewise given in DE 103 26 815 A1. In particular, alcoholic $SiO_2$-forming sols in which high-purity silicon nitride powder has been dispersed are used as $SiO_2$ precursors. The use of high-purity starting chemicals (silicon nitride powder, silanes, alcohols, etc.) is preferred since this makes it possible to obtain very highly pure layers which, in particular, meet the requirements of the solar industry.

The $SiO_2$-based high-temperature binder used according to the invention is an $SiO_2$-based binder which has been pretreated by heat treatment in a temperature range of 300-1300° C., preferably 700-1150° C., more preferably 800-1050° C., and as a result has an adjusted sinter activity, i.e. a reduced sinter activity.

The slip of the invention is a suspension of solid particles which preferably comprise 75-90% by weight of silicon nitride and 10-25% by weight of the $SiO_2$-based high-temperature binder, more preferably 80-88% by weight of silicon nitride and 12-20% by weight of the $SiO_2$-based high-temperature binder.

Preference is also given to the $SiO_2$-based high-temperature binder being present as granules. More preferably, both the silicon nitride and the $SiO_2$-based high-temperature binder are present as mixed granules.

In the case of a shaped body according to the invention, the release layer has a total oxygen content of 5-21% by weight. The oxygen content is introduced into the release layer essentially by the $SiO_2$-based binder. If the total oxygen content is less than 5% by weight, the mechanical properties, in particular, of the $Si_3N_4$-containing coating, e.g. adhesive strength, impact resistance, abrasion resistance and scratch resistance, deteriorate significantly. The bonding to the substrate is reduced and the effect of the higher adhesion forces compared to the cohesion forces is reduced. In particular, it is advantageous for the total oxygen content to be 6-18% by weight, more preferably 7-15% by weight, in order to achieve good mechanical properties. On the other hand, if the total oxygen content is above 21% by weight, there is a risk of the nonferrous metal melts coming into contact with the $Si_3N_4$-containing coating being contaminated by dissolution of oxygen in the melts and the release action of the coating towards the nonferrous metal melts decreasing.

Furthermore, it is possible to configure the release layer as a multiple layer in which has the outermost layer facing away from the substrate then has the above-described composition and a total oxygen content of not more than 21% by weight, preferably not more than 12% by weight. In one embodiment, the release layer is configured as a double layer comprising a first layer which is applied to the substrate and has a total oxygen content of not more than 27% by weight, preferably not more than 16% by weight, and a second layer having the above composition which is located on top of the first layer and has a total oxygen content of not more than 21% by weight, preferably not more than 12% by weight. In this double coating, the first layer serves as bonding layer and has a higher strength than the top layer. If damage to the upper layer nevertheless occurs, contact of the metal melt with the crucible is in any case prevented by the bottom layer. In addition, the coefficient of thermal expansion of the bottom layer is lower than that of the top layer, so that better matching of the coating to the crucible material in terms of thermal expansion is achieved thereby. This is advantageous in processes having sudden temperature changes. Multiple layers to achieve further degradation are likewise possible, with the limits for the upper and bottom layer being maintained.

The substrate of the shaped bodies of the invention appropriately comprises quartz, graphite, ceramic (including silicon nitride ceramic), $SiO_2$ (fused silica) or an iron alloy or else fibre mats or woven fabrics. In a preferred embodiment, the shaped body is a melting crucible having a substrate composed of quartz, graphite, ceramic or $SiO_2$ (fused silica) and is suitable for the processing of corrosive nonferrous metal melts, in particular silicon melts.

In another embodiment, the shaped body is a riser tube having a substrate composed of $SiO_2$ (fused silica) or an iron alloy or a high-strength or heat-resistant metallic alloy for aluminium metallurgy.

The release layer of the shaped bodies of the invention preferably has a thickness of 80-3000 µm, more preferably 150-2000 µm, even more preferably 200-500 µm.

The shaped bodies of the invention can be obtained by a process which comprises the following steps:
a) provision of a substrate,
b) application of a slip according to the invention to the substrate and
c) hardening of the applied slip by firing at an elevated temperature to form the durable, firmly adhering barrier layer.

In the case of nonmetallic substrates, the firing in step c) is carried out at temperatures of 700-1300° C., preferably 1000-1225° C., more preferably 1050-1200° C., even more preferably 1075-1175° C., particularly preferably 1100-1150° C.

When metallic substrates are used, the firing in step c) is carried out at temperatures of 500-1000° C., preferably 600-900° C., particularly preferably 700-850° C. In the case of metallic substrates, in-situ firing during use of the shaped bodies is particularly preferred.

A preferred overall process into which the production of the slip of the invention is also integrated comprises the following process steps:
1) mixing of precursors of the $SiO_2$-based high-temperature binder, preferably together with silicon nitride powder and, if appropriate, auxiliaries to obtain an intermediate 1,
2) granulation of the intermediate 1 to obtain granules as intermediate 2,
3) heat treatment of the intermediate 2 to obtain thermally treated granules as intermediate 3,
4) milling of the intermediate 3 to set the particle size,
5) dispersion of the product obtained in step 4), if appropriate addition of silicon nitride powder if this has not yet been used or not all been used in step 1) and also, if appropriate, addition of organic and inorganic binders to produce a suspension (slip) as intermediate 4,
6) application of the intermediate 4 to a substrate and
7) production of a shaped body according to the invention by firing the coating.

As silicon nitride powder in steps 1) and/or 5), preference is given to using a high-purity powder whose alkali metal and alkaline earth metal content is in each case not more than 1000 ppm and whose fluoride and chloride content is in each case not more than 2000 ppm, whose total carbon content is likewise not more than 2000 ppm and whose mean particle size $d_{50}$ is not more than 5 µm. The oxygen content of such high-purity silicon nitride powders is usually in the range from 1 to 1.5% by weight.

The precursors in step 1) are preferably the abovementioned nanocomposites composed of precursors of silicon dioxide or silicon nitride, e.g. organometallic compounds or salts of silicon, if appropriate with addition of silicon oxide nanoparticles. These are preferably mixed homogeneously with silicon nitride powder, e.g. in a wet milling step or other mixing apparatuses.

The auxiliaries in step 1) can be organic compounds such as polyvinyl butyral (PVB), polyvinyl alcohol (PVA), polyethylene glycol (PEG), waxes or ethanol-soluble polymers.

The granulation in step 2) is carried out, for example, by precipitation in a liquid, e.g. water or oil, or spray drying or other granulation techniques.

The suspension comprising the intermediate 1 is processed in customary granulation processes to give granules (intermediate 2), with the suspension being dried in a suitable vessel and a lumpy intermediate 2 being produced. The granulation is preferably carried out in a mixing apparatus, e.g. an Eirich mixer, to produce granules having a granule size in the range from 50 µm to a number of millimetres. The granulation is more preferably effected by precipitation in a liquid in which the intermediate 1 is insoluble or only sparingly soluble (or only partially soluble) and the precipitated granules have a granule size in the range from 10 µm to preferably a few millimetres, and the granulation is particularly preferably carried out by spray drying or spray buildup granulation, with the granule size ranging from a few µm to about 150 µm or from 20 to about 500 µm.

The heat treatment of the granules in step 3) at temperatures above 300° C. leads to removal of the organic auxiliaries (binder removal) and at temperatures of from 450° C. to 1300° C. (ignition) leads to strengthening of the granules.

The removal of the organic auxiliaries in step 3), which will also be referred to as "binder removal" below, takes place in air at temperatures in the range from 300° C. to 550° C., preferably 350° C.-500° C. and particularly preferably 400° C.-450° C. Binder removal can be carried out batchwise in crucibles (e.g. fused silica) or preferably in a rotary furnace.

In step 3), the granules from which the binder has been removed are likewise ignited, preferably in the range from 450° C. to 1300° C., more preferably 450° C.-1200° C. and particularly preferably 750° C.-1150° C. A suitable ignition temperature for the granules in order to set optimal layer properties of the fired coating should be set as a function of the binder content of the granules. The use of a mixture of granules which have been ignited at different temperatures is likewise possible.

In principle, higher firing temperatures are selected for higher binder contents. For example, a suitable ignition temperature for granules having a binder content of 15% by weight is 500-1000° C., preferably 600-900° C. and particularly preferably 750-850° C. At a binder content of the granules of, for example, 24% by weight, a suitable ignition temperature for the granules is 600-1100° C., preferably 700-1000° C. and particularly preferably 850-950° C.

The intermediate 3 contains the high-temperature binder according to the invention which has been formed as a result of the heat treatment, preferably together with silicon nitride.

The milling of the granules in step 4) serves to set the particle size, preferably an average particle size $d_{50}$ of not more than 30 µm, more preferably 1-15 µm, even more preferably 1.5-10 µm and particularly preferably 2-8 µm.

The milling of the granules in step 4) likewise preferably leads to a bimodal granule size distribution.

The dispersion in step 5) can be carried out in a separate process step or directly during milling in step 4) in an organic or inorganic solvent, preferably an alcohol and/or water. It is possible here to use inorganic or organic additives, e.g. PVB, PVA, PEG, waxes or ethanol-soluble polymers, in order to increase the stability of the suspension or the green strength of the applied layer.

In step 5), it is likewise possible to mix in additional components such as nanosize solid particles and/or precursors thereof prepared via a sol-gel process, preferably $SiO_2$— or $Si_3N_4$-forming nanoparticles or precursors thereof or silicon oxynitride. The proportion of the $SiO_2$ content of the slip resulting from the added particles or precursors should be not more than 3% by weight in order for the properties of the coatings according to the invention not to be impaired.

In the production according to the invention of the slip, contact with or breathing in of volatile, irritant or toxic substances can be minimized or ruled out in the process chain in closed systems. If, for example, granulation takes place in a spray dryer, pollution of environment and human beings can be minimized by the use of a downstream condensation unit in which volatile components are collected and recycled to the process. The same applies to the binder removal in which an after-combustion oxidizes volatile components. Unlike the processes in WO 2007/039310 A1 and DE 10 2005 050 593 A1, the preferred $Si_3N_4$-containing slips of the invention do not contain any irritating or hazardous components and as a result of ignition and granulation are so large in the slip and not respirable so that for the purposes of occupational hygiene only a simple half mask FFP2 in accordance with EN 149: 2001 is recommended for application of the layer by spraying when extraction is present. This means that there are no or only low health risks for the working steps of application and the subsequent handling (process steps having the highest exposure time for personnel) even in the case of a low degree of automation.

The application in step 6) of the prepared suspension is carried out using customary coating methods such as spraying, preferably wet-in-wet, or flooding on an inorganic substrate, e.g. fused silica. After application, the coating can be dried in air.

The production of the coated shaped body in step 7) is carried out by firing the coating at an elevated temperature. In the case of nonmetallic substrates, this is carried out at temperatures of from 700° C. to 1300° C., preferably 1000° C.-1225° C., more preferably 1050° C.-1200° C., more preferably 1075° C.-1175° C. and particularly preferably 1100-1150° C., and in the case of metallic substrates this is carried out at temperatures of 500-1000° C., preferably 600-900° C., particularly preferably 700-850° C., in each case preferably with a heating and cooling time of preferably 8 hours in each case and a hold time at maximum temperature of preferably one hour under air, or in a reducing or inert atmosphere or under gas pressure, e.g. nitrogen or argon. Firing of the coating under a reducing atmosphere, e.g. in a gas-fired furnace having a reducing atmosphere or a low oxygen partial pressure, is preferred since the silicon nitride in the coating is then oxidized less strongly.

When the slips are used for coating substrates for Al metallurgy, the silicon nitride powder used can also be of lower purity than for the melting of solar silicon.

The solids content of the coating suspension for application by flooding is appropriately from 40 to 65% by weight and for application by wet-in-wet spraying is from 35 to 55% by weight.

The shaped bodies of the invention having a durable, firmly adhering release layer are suitable for use in the field of corrosive nonferrous metal melts, e.g. melts of aluminium, silicon and the like. Shaped bodies in the form of melting crucibles are suitable, in particular, for producing silicon melts, for accommodating liquid silicon and for crystallizing liquid silicon to form silicon blocks.

Shaped bodies in the form of riser tubes are suitable, in particular, in aluminium metallurgy, very particularly preferably low-pressure aluminium casting.

EXAMPLES AND COMPARATIVE EXAMPLES

In the examples and comparative examples, the layer thicknesses indicated are based on the dry layer thicknesses after firing.

Tape Test:

The tape test is carried out by repeated sticking-on and pulling-off of an adhesive tape (Tesa 4651) on a specimen area of 1000 mm² which has been coated in a defined way. The adhesive tape is pulled off at an angle of 90° to the specimen surface. The test on the coatings was carried out until first regions of the substrate material were no longer covered by the coating or after the test had been repeated 15 times. After each pulling-off of the adhesive tape, the weight loss of the specimen was determined. The number of repetitions of the pull-off test were plotted against the weight loss in a graph (FIG. 1).

As the strength of the layer decreases, as in the case of pulverulent layers and/or coatings applied as powders, the measurable removal of material is greater (weight loss) and there is a higher risk that more coating material will be introduced into the melt, more coating material will be removed under mechanical stresses and the layer will be consumed more quickly, so that a release action will no longer be present.

Pull-Off Test (Adhesive Strength):

The adhesive strength was determined by measuring the force which is required for pulling-off a plate which has been adhesively bonded onto the fired coating of a coated specimen (area of adhesive bonding=500 mm²) The plate was adhesively bonded on by means of a two-component epoxy resin adhesive which, due to its high viscosity, penetrates not more than 50-80 µm into the coatings. The adhesive strength perpendicular to the surface of the layer was determined in N/mm². After the pull-off test, the rupture surface was examined and an assessment was made as to whether rupture had occurred in the coating (cohesion) or in the contact interface to the substrate (adhesion). The layer thickness of the coated specimens tested was in the range from 250 to 450 µm.

The pull-off test gives information about the adhesion of the layer to the substrate or about the strength of the layer in the case of the adhesion forces exceeding the cohesion forces, which, as indicated above, is a desirable effect.

Comparative Example 1

Standard Suspension

This is a suspension of silicon nitride powder (UBE E10) in distilled water without further additives which has been produced as described in EP 963 464 B1.

For further processing (brushing, rolling, spraying), only the rheology of this suspension is critical. Accordingly, the solids content is set, for example to 30% by weight for application by means of a spray gun.

The suspension is applied, if appropriate in a number of layers, to a cleaned, dust-free, dry fused silica crucible so as to produce a homogeneous layer thickness of 350 μm. After drying, the coating is fired before use as melting crucible at 900° C.

The silicon nitride powder coating obtained should be bubble- and crack-free and also have no other defects. The silicon nitride layer produced in this way has only limited resistance to contact and should be treated correspondingly carefully. It is not only necessary to avoid damage to the coating during charging with pieces of Si but charging also has to be carried out so that slipping of pieces of Si is avoided during melting, so that no defects are produced in the powder layer during melting either.

Comparative Example 2

Standard Suspension

50% by weight of silicon nitride powder (UBE E10) in ethanol are homogenized. The suspension is applied to a cleaned, dust-free, dry fused silica crucible. Coating of the crucible by means of flooding is not possible since cracks are formed in the coating during drying above a layer thickness of 150-200 μm, which leads to detachment of areas of the coating before firing of the coating. Wetting of the crucible with ethanol before application could not prevent this effect. Even when 2% of PVA Celvol E 04/88 (Celanese Emulsions GmbH) was added to the ethanol-silicon nitride suspension, crack-free layer thicknesses of >250 μm could not be achieved in the case of application by flooding or wet-in-wet spraying.

Comparative Example 3

Standard Suspension

50% by weight of silicon nitride powder (UBE E10) in ethanol are homogenized. The suspension is applied to a cleaned, dust-free, dry fused silica crucible. The coating is applied by spraying. It is found that wet-in-wet spraying of the suspension is not possible since cracks are formed in the coating above a layer thickness of about 200 μm. The coatings are sprayed on in powder form.

After drying, the coatings are fired at about 1000° C. before use as a melting crucible. The silicon nitride layer produced in this way has only limited resistance to contact and should be treated correspondingly carefully.

The adhesive strength of the coating is 0.21 N/mm²; the results of the tape test are shown in FIG. 1.

In addition, the coating suspension was applied by flooding, in which case the coating ruptures during drying or firing and becomes detached in flakes. The adhesive strength could therefore not be measured here (see Table 1).

Comparative Examples 4a and 4b

A coating suspension was produced as described in WO 2007/039310 A1, Example 1b. The coating was applied by pulverulent spraying or wet-in-wet spraying and was fired at 500° C. (4a) or 750° C. (4b). Both in the case of pulverulent spraying and in the case of wet-in-wet spraying, spraying is carried out by means of a reactive liquid as indicated in WO 2007/039310 A1.

The coating after firing is powdery and not resistant to contact. The adhesive strength of the coating sprayed on in pulverulent form is indicated in Table 1; the results of the tape test are shown in FIG. 1.

The coating applied by wet-in-wet spraying ruptures during drying or firing at a layer thickness of >80-150 μm and becomes detached. The adhesive strength could therefore not be measured here.

Comparative Example 5

The intermediate 1 is produced by homogenization of 930 g of ethanol, 150 g of finely divided silica (HDK, Wacker), 474 g of silicon nitride powder (UBE E10) and 16 g of PVB by means of silicon nitride milling media in a PE container on a set of rollers. The intermediate 2 is produced by pouring intermediate 1 into a flat PE container and drying in an explosion-protected drying oven. The binder is removed from the lumpy granular material at 450° C. in air in a fused silica crucible. To produce intermediate 3, the granules are ignited by heat treatment at 900° C. in a covered crucible. 750 g of ethanol and 750 g of intermediate 3 are milled and homogenized in a PE container by means of milling media to produce intermediate 4. The average particle size of intermediate 4 is <1 μm. The intermediate 4 is applied in a layer thickness of about 250 μm to a fused silica crucible by flooding. The layer is dried in air for 24 hours and subsequently fired at 1125° C. with a heating and cooling time of 8 hours.

The coating after firing is not resistant to contact.

Comparative Example 6

The intermediate 1 is produced by homogenization of 650 g of ethanol, 150 g of fused silica ($d_{50}$=2 μm), 474 g of silicon nitride powder (UBE E10) and 16 g of PVB by means of silicon nitride milling media in a PE container on a set of rollers. The intermediate 2 is produced by pouring intermediate 1 into a flat PE container and drying in an explosion-protected drying oven. The binder is removed from the lumpy granular material at 450° C. in air in a fused silica crucible. To produce intermediate 3, the granules are ignited by heat treatment at 900° C. in a covered crucible. 500 g of ethanol and 750 g of intermediate 3 are milled and homogenized in a PE container by means of milling media to produce intermediate 4. The average particle size of intermediate 4 is 2 μm. The intermediate 4 is applied in a layer thickness of about 350 μm to a fused silica crucible by flooding. The layer is dried in air for 24 hours and subsequently fired at 1125° C. with a heating and cooling time of 8 hours.

The coating after firing is not resistant to contact.

Example 1

The intermediate 1 is produced by homogenization of 3000 g of Inosil S-B (Inosil grade S-B 38 from Inomat GmbH: this commercially available binder is a mixture of organosilicon compounds, i.e. $SiO_2$ precursors, and $SiO_2$ nanoparticles), 1000 g of ethanol, 4000 g of silicon nitride powder (UBE E10) and 400 g of PVB (polyvinyl butyral BM 18, Wacker) by means of silicon nitride milling media in a PE container on a set of rollers.

The intermediate 2 is produced by pouring intermediate 1 into a flat PE container and drying in an explosion-protected drying oven. The binder is removed from the lumpy granular material at 450° C. in air in a fused silica crucible. To produce intermediate 3, the granules are ignited in a heat treatment at 900° C. in a covered crucible for one hour. 500 g of ethanol and 750 g of intermediate 3 are milled and homogenized in a PE container by means of SN milling media to produce intermediate 4. The average particle size of intermediate 4 is 4 μm. The intermediate 4 is applied in a layer thickness of about 300 μm to a fused silica crucible by flooding once. The layer is dried in air for 24 hours and subsequently fired at 1125° C. with a heating and cooling time of 8 hours.

The coating is defect-free and not powdery. The binder content of the coating is 20% by weight.

Example 2

The intermediate 1 is produced by homogenization of 3000 g of Inosil S-B, 1000 g of ethanol, 4000 g of UBE E10 and 100 g of PVB by means of silicon nitride milling media in a PE container on a set of rollers.

The intermediate 2 is produced by spray granulation of intermediate 1. The binder is removed from the granular material at 450° C. in air in a fused silica crucible. To produce intermediate 3, the granules are ignited in a heat treatment at 900° C. in a covered crucible for one hour. 500 g of ethanol and 750 g of intermediate 3 are milled and homogenized in a PE container by means of milling media to produce intermediate 4. The average particle size of intermediate 4 is 5-6 μm. The intermediate 4 is applied in a layer thickness of about 300 μm to a fused silica crucible by flooding once. The layer is dried in air for 24 hours and subsequently fired at 1125° C. with a heating and cooling time of 8 hours.

The coating is defect-free and not powdery. The binder content of the coating is 20% by weight.

Example 3

The intermediate 1 is produced by homogenization of 3000 g of Inosil S-B, 1000 g of ethanol, 4000 g of UBE E10 and 100 g of PVB by means of silicon nitride milling media in a PE container on a set of rollers. The intermediate 2 is produced by spray granulation of intermediate 1. The binder is removed from the granular material at 450° C. in air in a fused silica crucible. To produce intermediate 3, the granules are ignited in a heat treatment at 900° C. in a covered crucible for one hour. 600 g of ethanol and 750 g of intermediate 3 are milled and homogenized in a PE container with addition of 75 g of PEG 400 and 75 g of PVB by means of milling media to produce intermediate 4. The average particle size of intermediate 4 is 5 μm. The intermediate 4 is applied in a layer thickness of about 350 μm to a fused silica crucible by means of wet-in-wet spraying. The layer is dried in air for 24 hours and subsequently fired at 1125° C. with a heating and cooling time of 8 hours.

The coating is defect-free and not powdery.

The adhesive strength of the coating is shown in Table 1, and the results of the tape test are shown in FIG. 1. The density of the coating is 1.20 g/cm³. The binder content of the coating is 20% by weight.

Examples 4-7

Examples 4 to 7 were produced as described in Example 2, but the ignition temperature for the granules and the firing temperature for the layer were varied as shown in Table 1.

The coatings are defect-free and not powdery. The adhesive strength of the coatings is shown in Table 1.

The binder content of the coatings is 20% by weight.

Example 8

The intermediate 1 is produced by homogenization of 4500 g of Inosil S-B, 4800 g of UBE E10 and 160 g of PVB by means of silicon nitride milling media in a PE container on a set of rollers.

The intermediate 2 is produced by spray granulation of intermediate 1. The binder is removed from the granular material at 450° C. in air in a fused silica crucible. To produce intermediate 3, the granules are ignited in a heat treatment at 1000° C. in a covered crucible for one hour. 500 g of ethanol and 750 g of intermediate 3 are milled and homogenized in a PE container by means of milling media to produce intermediate 4. The average particle size of intermediate 4 is 6 μm. The intermediate 4 is applied in a layer thickness of about 300 μm to a fused silica crucible by flooding once. The layer is dried in air for 24 hours and subsequently fired at 1125° C. with a heating and cooling time of 8 hours.

The coating is defect-free and not powdery. The results of the tape test for Example 8 are shown in FIG. 1. The binder content of the coating is 24% by weight. The oxygen content of the coating is 16.1% by weight.

Example 9

The intermediate 1 is produced by homogenization of 3000 g of Inosil S-B, 1000 g of ethanol, 4000 g of UBE E10 and 100 g of PVB by means of silicon nitride milling media in a PE container on a set of rollers. The intermediate 2 is produced by spray granulation of intermediate 1. The binder is removed from the granular material at 450° C. in air in a fused silica crucible. To produce intermediate 3, the granules are ignited in a heat treatment at 1000° C. under a nitrogen atmosphere in a crucible for one hour. 500 g of ethanol and 750 g of intermediate 3 are milled and homogenized in a PE container by means of milling media to produce intermediate 4. The average particle size of intermediate 4 is 5 μm. The intermediate 4 is applied in a layer thickness of about 300 μm to a fused silica crucible by flooding once. The layer is dried in air for 24 hours and subsequently fired at 1125° C. with a heating and cooling time of 8 hours.

The coating is defect-free and not powdery. The binder content of the coating is 20% by weight.

Example 10

The intermediate 1 is produced by homogenization of 3000 g of Inosil S-B, 1000 g of ethanol, 4000 g of UBE E10 and 100 g of PVB by means of silicon nitride milling media in a PE container on a set of rollers.

The intermediate 2 is produced by spray granulation of intermediate 1. The binder is removed from the granular material at 450° C. in air in a fused silica crucible. To produce intermediate 3, the granules are ignited in a heat treatment at 900° C. in a covered crucible for one hour. 470 g of ethanol and 750 g of intermediate 3 are milled and homogenized in a PE container by means of milling media to produce intermediate 4. The average particle size of intermediate 4 is 5 μm.

The intermediate 4 is applied in a layer thickness of about 450 μm to a fused silica crucible by flooding once. The layer is dried in air for 24 hours and subsequently fired at 1125° C. with a heating and cooling time of 8 hours.

The coating is defect-free and not powdery. The binder content of the coating is 20% by weight.

Example 11

The intermediate 1 is produced by homogenization of 500 g of ethanol, 3000 g of Inosil S-B, 4000 g of UBE E10 and 300 g of PVB by means of silicon nitride milling media in a PE container on a set of rollers. The intermediate 2 is produced by precipitation of intermediate 1 in water, with the intermediate 1 being added dropwise to 20 l of distilled water while stirring vigorously. The granule size is about 1-3 mm.

The binder is removed from the granular material at 450° C. in air in a fused silica crucible. To produce intermediate 3, the granules are ignited in a heat treatment at 1000° C. in a covered crucible for one hour. 500 g of ethanol and 750 g of intermediate 3 are milled and homogenized in a PE container by means of milling media to produce intermediate 4. The average particle size of intermediate 4 is 5 μm. The intermediate 4 is applied in a layer thickness of about 300 μm to a fused silica crucible by flooding once. The layer is dried in air for 24 hours and subsequently fired at 1125° C. with a heating and cooling time of 8 hours.

The coating is defect-free and not powdery. The binder content of the coating is 20% by weight.

Example 12

The intermediate 1 is produced by homogenization of 1200 g of ethanol, 2450 g of Inosil S-B, 4580 g of UBE E10 and 200 g of PVB by means of silicon nitride milling media in a PE container on a set of rollers. The intermediate 2 is produced by spray granulation of intermediate 1. The binder is removed from the granular material at 450° C. in air in a fused silica crucible. To produce intermediate 3, the granules are ignited in a heat treatment at 800° C. in a covered crucible for one hour. 500 g of ethanol and 750 g of intermediate 3 are milled and homogenized in a PE container by means of milling media to produce intermediate 4. The average particle size of intermediate 4 is 2.5 μm. The intermediate 4 is applied in a layer thickness of about 400 μm to a fused silica crucible by flooding once. The layer is dried in air for 24 hours and subsequently fired at 1125° C. in air for one hour with a heating and cooling time of 8 hours.

The coating is defect-free and not powdery.

The adhesive strength of the coating is shown in Table 1, and the results of the tape test are shown in FIG. 1. The density of the coating is 1.22 g/cm$^3$. The binder content of the coating is 15% by weight. The oxygen content of the coating is 13% by weight.

Example 13

The intermediate 1 is produced by homogenization of 1200 g of ethanol, 2450 g of Inosil S-B, 4580 g of UBE E10 and 200 g of PVB by means of silicon nitride milling media in a PE container on a set of rollers.

The intermediate 2 is produced by spray granulation of intermediate 1. The binder is removed from the granular material at 450° C. in air in a fused silica crucible. To produce intermediate 3, the granules are ignited in a heat treatment at 900° C. in a covered crucible for one hour. 500 g of ethanol and 750 g of intermediate 3 are milled and homogenized in a PE container by means of milling media to produce intermediate 4. The average particle size of intermediate 4 is 5 μm. The intermediate 4 is applied in a layer thickness of about 350 μm to a fused silica crucible by flooding once. The layer is dried in air for 24 hours and subsequently fired at 1125° C. in a gas-fired furnace with a heating and cooling time of 8 hours.

The coating is defect-free and not powdery.

The adhesive strength of the coating is shown in Table 1, and the results of the tape test are shown in FIG. 1. The binder content of the coating is 15% by weight. The oxygen content of the coating is 11.3% by weight.

Example 14

The intermediate 1 is produced by homogenization of 1200 g of ethanol, 2450 g of Inosil S-B, 4580 g of UBE E10 and 200 g of PVB by means of silicon nitride milling media in a PE container on a set of rollers. The intermediate 2 is produced by spray granulation of intermediate 1. The binder is removed from the granular material at 450° C. in air in a fused silica crucible. To produce intermediate 3, the granules are ignited in a heat treatment at 800° C. in a covered crucible for one hour. 470 g of ethanol and 750 g of intermediate 3 are milled and homogenized in a PE container by means of milling media to produce intermediate 4. The average particle size of intermediate 4 is 2.5 μm. The intermediate 4 is applied in a layer thickness of about 2000 μm to a fused silica crucible by flooding. The layer is dried in air for 24 hours and subsequently fired at 1125° C. in air with a heating and cooling time of 8 hours.

The coating is defect-free and not powdery. The binder content of the coating is 15% by weight. The oxygen content of the coating is 12.6% by weight.

Example 15

The intermediate 1 is produced by homogenization of 1200 g of ethanol, 2450 g of Inosil S-B, 4580 g of UBE E10 and 200 g of PVB by means of silicon nitride milling media in a PE container on a set of rollers. The intermediate 2 is produced by spray granulation of intermediate 1. The binder is removed from the granular material at 450° C. in air in a fused silica crucible. To produce intermediate 3, the granules are ignited in a heat treatment at 900° C. under a nitrogen atmosphere in a rotary tube furnace at a residence time of 40 minutes. 500 g of ethanol and 750 g of intermediate 3 are milled and homogenized in a PE container by means of milling media to produce intermediate 4. The average particle size of intermediate 4 is 6 μm. The intermediate 4 is applied in a layer thickness of about 400 μm to a fused silica crucible by flooding once. The layer is dried in air for 24 hours and subsequently fired at 1125° C. in a gas-fired furnace with a heating and cooling time of 8 hours.

The coating is defect-free and not powdery. The binder content of the coating is 15% by weight. The oxygen content of the coating is 9.1% by weight.

DETAILED DESCRIPTION OF THE FIGURES

FIG. 1 shows the results of the tape test.

Figure 2A:
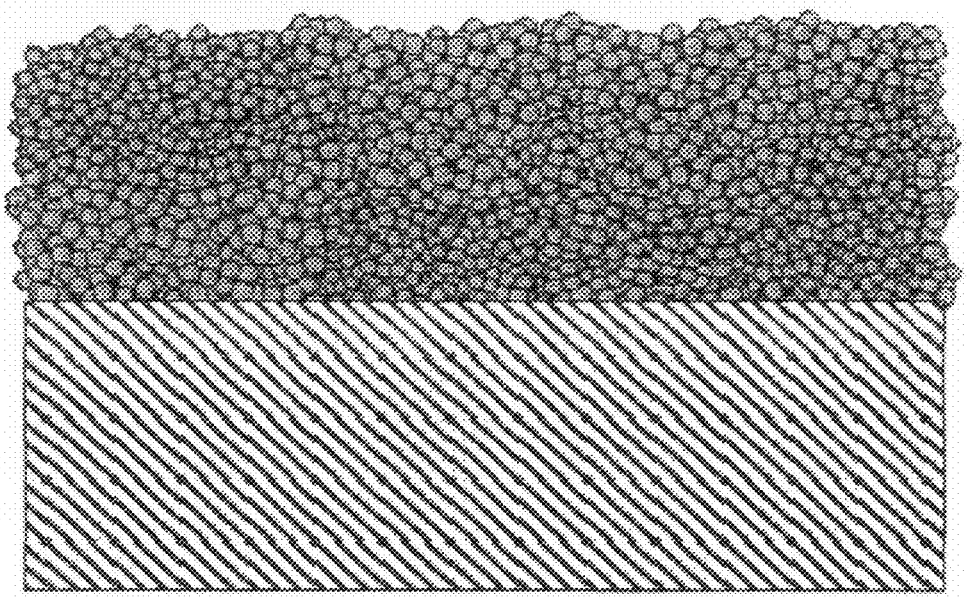
FIG. 2a schematically shows a layer according to the invention which has not been applied by powder coating.
Figure 2B:
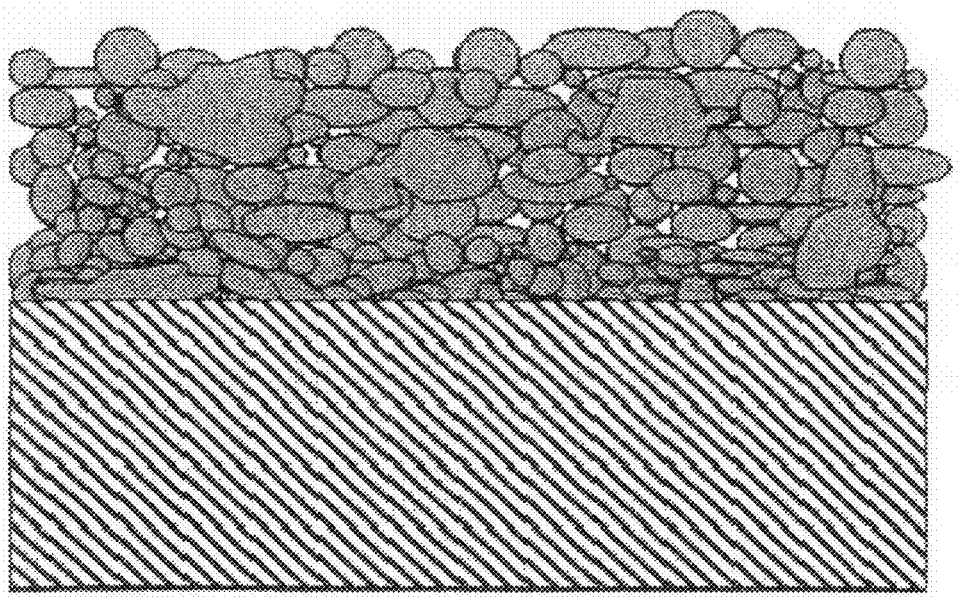
FIG. 2b schematically shows a layer according to the prior art which has been applied by powder coating.

FIGS. 2a and 2b show a comparison of schematic depictions of a layer applied in pulverulent form (FIG. 2b) according to the prior art (EP 963 464 B1, WO 2007/039310 A1) and a layer according to the invention which has not been applied in pulverulent form (FIG. 2a). The pulverulent layers have a low adhesive strength and defects can easily occur as a result of mechanical stress. In addition, powder residues which have become detached from the crucible walls or from the bottom of the crucible, e.g. during charging, can be introduced into the melt by convection in the process and lead to contamination of the silicon ingot. Infiltration of the layer due to the high porosity and the presence of large pores can lead to the same effect.

Examples 1 to 15 lead to a layer corresponding to the depiction in FIG. 2a. Here, the fineness of the aggregates corresponding to the milling of the granulated silicon nitride in the coating suspension is 0.2 μm-30 μm (primary and aggregate size). The size of the pores is typically <5 μm, predominantly <2 μm.

Layers corresponding to the depiction in FIG. 2b are formed in the Comparative Examples 1 to 3 and also 4a and 4b when they are applied in pulverulent form. The typical aggregate size in coatings sprayed in pulverulent form is as follows:

1-25 μm (predominantly: primary aggregates, droplet size from spray mist)
25-50 μm (few primary aggregates of this size)
10-80 μm (composites of a few aggregates)
50-400 μm (composites of many aggregates)

Typical size of round to sheet-like pores between primary aggregates or aggregate composites: 1-20 μm (predominantly)

Figure 2C:
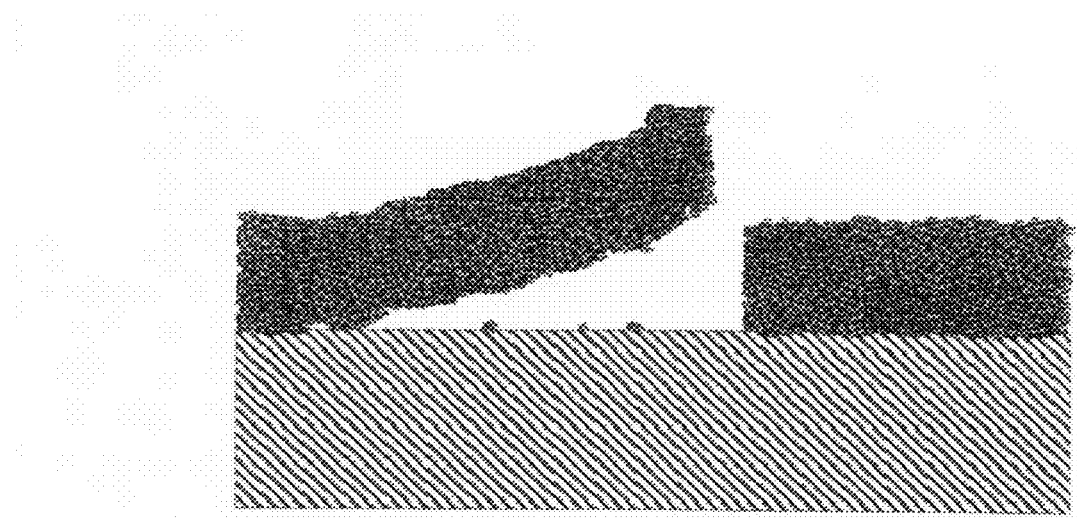
FIG. 2c schematically shows chipping.

FIG. 2c shows a schematic depiction of chipping.

Cracks (radial cracks perpendicular to the surface) which can be formed due to shrinkage on drying or inhomogeneities in binder concentration and density can occur as layer defects in coatings. When drying progresses further, during firing or as a result of further progression in shrinkage during use of the crucibles, the cracks can become larger and chipping can then result.

Chipping takes place when stresses in the coating lead to localized detachment of the coating from the substrate, e.g. in the case of excessively high shrinkage of the binder, relatively large inhomogeneities in the density of the layer (which can occur, in particular, in the case of pulverulent spray coatings and leads to non-uniform shrinkage), inhomogeneities in the binder concentration in the coating (depletion in sol-gel binders which results from diffusion into the substrate and thus leads to a high binder concentration in the surface of the layer and thus to nonuniform shrinkage), defects in the coating (e.g. scattered large pores (air bubbles), cracks (e.g. drying cracks) or defects which are introduced into the coating, e.g. during charging of a silicon ingot or in the reorientation of lumpy silicon which is just melting).

Layers in which the chipping effect occurs to an increased extent are formed in Comparative Examples 4a and 4b when they are applied by wet-in-wet spraying or flooding and likewise in the case of coatings as described in DE 10 2005 050 593 A1 when they are applied by these application methods and have layer thicknesses above about 180 μm.

Table 1 shows the experimental results of the pull-off test.

TABLE 1

Experimental results of the pull-off test

| Examples | Ignition temperature for granules [° C.] | Firing temperature for coating [° C.] | Coating method | Adhesion [n/mm²] | Better adhesion than cohesion |
|---|---|---|---|---|---|
| Comparative Example 3 | — | 1000 | sprayed in pulverulent form | 0.21 | no, locally detached |
| Comparative Example 4a | — | 500 | sprayed in pulverulent form | 0.23 | yes |
| Comparative Example 4b | — | 750 | sprayed in pulverulent form | 0.27 | yes |
| Comparative Example 3 | — | 1000 | flooded | nm | no, detached in sheetlike pieces |
| Comparative Example 4a | — | 500 | sprayed wet-in-wet | nm | no, chipping |
| Comparative Example 4b | — | 750 | sprayed wet-in-wet | nm | no, chipping |
| Example 3 | 900 | 1125 | sprayed wet-in-wet | 1.05 | yes |
| Example 4 | 750 | 1125 | flooded | 0.49 | yes |
| Example 5 | 800 | 1050 | flooded | 0.52 | yes |
| Example 6 | 800 | 1100 | flooded | 0.85 | yes |
| Example 7 | 800 | 1125 | flooded | 1.29 | yes |
| Example 8 | 1000 | 1125 | flooded | 0.95 | yes |
| Example 12 | 800 | 1125 | sprayed wet-in-wet | 0.48 | yes |
| Example 13 | 900 | 1125 | flooded | 0.88 | yes |

* not measurable (see explanation in the examples)

The invention claimed is:

1. A slip, comprising: a suspension of solid particles, wherein the solid particles comprise 67-95% by weight of silicon nitride and 5-33% by weight of an $SiO_2$-based high-temperature binder having a lower sintering activity and the $SiO_2$-based high-temperature binder is derived from $SiO_2$ precursors and has been pretreated by heat treatment in a temperature range of 300-1300° C.

2. The slip according to claim 1, wherein the $SiO_2$-based high-temperature binder is derived from organosilicon $SiO_2$ precursors prepared via a sol-gel process, preferably from a nanocomposite comprising organosilicon $SiO_2$ precursors prepared via a sol-gel process and likewise containing nanosize solid particles.

3. The slip according to claim 2, wherein the nanosize solid particles are selected from the group consisting of $SiO_2$, $TiO_2$, $ZrO_2$, $Al_2O_3$, $AlOOH$, $Y_2O_3$, $CeO_2$, carbon, BN and precursors of these nanosize solid particles which are converted into these solid particles by means of the sol-gel process.

4. The slip according to claim 2, wherein the nanosize solid particles are $SiO_2$ particles.

5. The slip according to claim 2, wherein the nanosize solid particles have been modified by a surface-modifying agent which contains one or more selected from the group consisting of an anhydride group, acid amide group, amino group, SiOH group, hydrolysable radicals of silanes and a β-dicarbonyl group.

6. The slip according to claim 1, wherein the $SiO_2$-based high-temperature binder has been obtained by the sol-gel process by reaction of one or more silanes of the general formula (I):

$$R_xSiA_{(4-x)} \quad (I)$$

where the radicals A are identical or different and are hydroxyl groups or hydrolysable groups, the radicals R are identical or different and are nonhydrolysable groups and x is 0, 1, 2 or 3, with at least 50 mol% of the silanes having x≧1, and heat treatment of the resulting reaction product in a temperature range of 300-1300° C.

7. The slip according to claim 2, wherein the nanocomposite has been obtained by the sol-gel process by reaction of nanosize solid particles with one or more silanes of the general formula (I):

$$R_xSiA_{(4-x)} \quad (I)$$

where the radicals A are identical or different and are hydroxyl groups or hydrolysable groups, the radicals R are identical or different and are nonhydrolysable groups and x is 0, 1, 2 or 3, with at least 50 mol % of the silanes having x≧1.

8. The slip according to claim 1, wherein the $SiO_2$-based high-temperature binder has been pretreated by heat treatment in the temperature range of 700-1150° C.

9. The slip according to claim 1, wherein mixtures of $SiO_2$-based high-temperature binders which have been pretreated at different temperatures are present.

10. The slip according to claim 1, wherein the solid particles comprise 75-90% by weight of silicon nitride and 10-25% by weight of the $SiO_2$-based high-temperature binder.

11. The slip according to claim 1, wherein the $SiO_2$-based high-temperature binder is present as granules.

12. The slip according to claim 1, wherein the silicon nitride and the $SiO_2$-based high-temperature binder are present as mixed granules.

13. The slip according to claim 8, wherein the $SiO_2$-based high-temperature binder has been pretreated by heat treatment in the temperature range of 800-1050° C.

14. The slip according to claim 10, wherein the solid particles comprise 80-88% by weight of silicon nitride and 12-20% by weight of the $SiO_2$-based high-temperature binder.

15. A shaped body which comprises a substrate having a durable, firmly adhering release layer, said shaped body obtained by a process comprising:
   a) providing a substrate;
   b) applying a slip according to claim 1 to the substrate; and
   c) hardening the applied slip by firing at an elevated temperature to form the durable, firmly adhering release layer comprising 67-95% by weight of silicon nitride, 5-33% by weight of an $SiO_2$-based high-temperature binder and a total oxygen content of 5-21% by weight.

16. The shaped body according to claim 15, wherein the release layer comprises 75-90% by weight of silicon nitride and 10-25% by weight of the $SiO_2$-based high-temperature binder.

17. The shaped body according to claim 15, wherein the release layer has a total oxygen content of 6-18% by weight.

18. The shaped body according to claim 15, wherein the release layer is configured as a multiple layer in which the outermost layer facing away from the substrate has a total oxygen content of not more than 21% by weight.

19. The shaped body according claim 15, wherein the release layer is configured as a double layer comprising a first layer which is applied to the substrate and has a total oxygen content of not more than 27% by weight, and a second layer which is located on top of the first layer and has a total oxygen content of not more than 21% by weight.

20. The shaped body according to claim 15, wherein the substrate comprises quartz, graphite, ceramic, $SiO_2$ (fused silica) or an iron alloy.

21. The shaped body according to claim 15, which comprises a nonmetallic substrate, wherein the hardening of the applied slip is carried out by firing in step c) at a temperature of 700-1300° C.

22. The shaped body according to claim 15, which comprises a metallic substrate, wherein the hardening of the applied slip is carried out by firing in step c) at a temperature of 500-1000° C.

23. The shaped body according to claim 15, which is a melting crucible having a substrate composed of quartz, graphite, ceramic or $SiO_2$ (fused silica) for corrosive nonferrous metal melts.

24. The shaped body according to claim 15, which is a riser tube having a substrate composed of $SiO_2$ (fused silica) or an iron alloy for Al metallurgy.

25. The shaped body according to claim 15, wherein the release layer has a thickness of 80-3000 μm.

26. The shaped body according to claim 16, wherein the release layer comprises 80-88% by weight of silicon nitride and 12-20% by weight of the $SiO_2$-based high-temperature binder.

27. The shaped body according to claim 17, wherein the release layer has a total oxygen content of 7-15% by weight.

28. The shaped body according to claim 18, wherein the release layer is configured as a multiple layer in which the outermost layer facing away from the substrate has a total oxygen content of not more than 12% by weight.

29. The shaped body according claim 19, wherein the release layer is configured as a double layer comprising a first layer which is applied to the substrate and has a total oxygen content of not more than 16% by weight, and a second layer which is located on top of the first layer and has a total oxygen content of not more than 12% by weight.

30. The shaped body according to claim 21, which comprises a nonmetallic substrate, wherein the hardening of the applied slip is carried out by firing in step c) at a temperature of 1000-1225° C.

31. The shaped body according to claim 21, which comprises a nonmetallic substrate, wherein the hardening of the applied slip is carried out by firing in step c) at a temperature of 1050-1200° C.

32. The shaped body according to claim 21, which comprises a nonmetallic substrate, wherein the hardening of the applied slip is carried out by firing in step c) at a temperature of 1075-1175° C.

33. The shaped body according to claim 21, which comprises a nonmetallic substrate, wherein the hardening of the applied slip is carried out by firing in step c) at a temperature of 1100-1150° C.

34. The shaped body according to claim 22, which comprises a metallic substrate, wherein the hardening of the applied slip is carried out by firing in step c) at a temperature of 600-900° C.

35. The shaped body according to claim 22, which comprises a metallic substrate, wherein the hardening of the applied slip is carried out by firing in step c) at a temperature of 700-850° C.

36. The shaped body according to claim 25, wherein the release layer has a thickness of 150-2000 μm.

37. The shaped body according to claim 25, wherein the release layer has a thickness of 200-500 μm.

38. A process for producing a shaped body comprising:
a) providing a substrate;
b) applying a slip according to claim 1 to the substrate; and
c) hardening of the applied slip by firing at an elevated temperature to form the durable, firmly adhering release layer comprising 67-95% by weight of silicon nitride, 5-33% by weight of an $SiO_2$-based high-temperature binder and a total oxygen content of 5-21% by weight.

39. The process according to claim 38, wherein a nonmetallic substrate is provided in step a) and the hardening of the applied slip in step c) is carried out by firing at a temperature of 700-1300° C.

40. The process according to claim 38, wherein a metallic substrate is provided in step a) and the hardening of the applied slip in step c) is carried out by firing at a temperature of 500-1000° C.

41. The process according to claim 39, wherein a nonmetallic substrate is provided in step a) and the hardening of the applied slip in step c) is carried out by firing at a temperature of 1000-1225° C.

42. The process according to claim 39, wherein a nonmetallic substrate is provided in step a) and the hardening of the applied slip in step c) is carried out by firing at a temperature of 1050-1200° C.

43. The process according to claim 39, wherein a nonmetallic substrate is provided in step a) and the hardening of the applied slip in step c) is carried out by firing at a temperature of 1075-1175° C.

44. The process according to claim 39, wherein a nonmetallic substrate is provided in step a) and the hardening of the applied slip in step c) is carried out by firing at a temperature of 1100-1150° C.

45. The process according to claim 40, wherein a metallic substrate is provided in step a) and the hardening of the applied slip in step c) is carried out by firing at a temperature of 600-900° C.

46. The process according to claim 40, wherein a metallic substrate is provided in step a) and the hardening of the applied slip in step c) is carried out by firing at a temperature of 700-850° C.

47. A method of producing corrosive nonferrous metal melts comprising melting a corrosive nonferrous metal in the shaped body of claim 15.

* * * * *